US007088006B2

United States Patent
Janke et al.

(10) Patent No.: US 7,088,006 B2
(45) Date of Patent: Aug. 8, 2006

(54) INTEGRATED CIRCUIT ARRANGEMENT

(75) Inventors: Marcus Janke, Munich (DE); Peter Laackmann, Munich (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 11/045,002

(22) Filed: Jan. 26, 2005

(65) Prior Publication Data

US 2005/0161787 A1 Jul. 28, 2005

(30) Foreign Application Priority Data

Jan. 28, 2004 (DE) ................. 10 2004 004 289

(51) Int. Cl.
*H01L 23/48* (2006.01)
*H01L 23/52* (2006.01)

(52) U.S. Cl. .................. 257/783; 257/730; 257/739; 257/E21.514

(58) Field of Classification Search ................ 257/678, 257/679, 783, 922, E21.514, 729, 730, 739, 257/753; 438/118, 119
See application file for complete search history.

(56) References Cited

U.S. PATENT DOCUMENTS

| 3,702,464 | A | * | 11/1972 | Castrucci | 235/492 |
|---|---|---|---|---|---|
| 4,754,319 | A | * | 6/1988 | Saito et al. | 257/679 |
| 5,280,192 | A | | 1/1994 | Kryzaniwsky | |
| 6,513,718 | B1 | * | 2/2003 | Bouchez et al. | 235/492 |
| 6,642,611 | B1 | * | 11/2003 | Iwasaki | 257/679 |
| 6,756,689 | B1 | * | 6/2004 | Nam et al. | 257/783 |
| 6,839,963 | B1 | * | 1/2005 | Haghiri-Tehrani et al. | 29/852 |
| 2003/0057525 | A1 | | 3/2003 | Fock et al. | |

FOREIGN PATENT DOCUMENTS

DE 195 35 324 C1 1/1997
DE 101 06 836 A1 9/2002

* cited by examiner

*Primary Examiner*—Jasmine Clark
(74) *Attorney, Agent, or Firm*—Dickstein, Shapiro, Morin & Oshinsky, LLP.

(57) ABSTRACT

Integrated circuit arrangement, in which bearing areas of mutually opposing sides of a carrier and of a substrate layer, which carries circuit structures, are bonded by means of an adhesive layer. The adhesive bond is produced from adhesives forming at least two adhesive tracks. The first adhesive track is formed in a region of an externally accessible seam between the substrate layer and the carrier, and the second adhesive track is formed parallel to the first adhesive track in an inner region of the bearing areas that face one another.

21 Claims, 1 Drawing Sheet

INTEGRATED CIRCUIT ARRANGEMENT

CROSS-REFERENCE TO RELATED APPLICATION

This application claims priority from German Patent Application Serial No. 102004004289.6, filed Jan. 28, 2004, which is incorporated herein by reference in its entirety.

FIELD OF THE INVENTION

The invention relates to an integrated circuit arrangement, in which bearing areas of mutually opposite sides of a carrier and of a layer, which carries circuit structures, of a substrate are bonded by means of an adhesive layer.

BACKGROUND OF THE INVENTION

Semiconductor chips which have integrated circuit arrangements and which contain security-relevant information, in particular semiconductor chips with an integrated circuit provided for smart cards, require the provision of protective measures which prevent the contents of the integrated circuit from being spied out. Conventional housings or coverings for semiconductor chips do not afford sufficient protection if the housings can be removed or a protective covering can be ground or etched away.

Security-relevant data, such as access codes, passwords or personal details, are often stored in the integrated circuit arrangements. Therefore, there is major interest in keeping this information secret. Algorithms which are to be kept secret and are integrated in the circuit arrangements, by way of example, in the event that they are disclosed by being read by means of optical and/or electron-optical examination techniques, bring about an immense economic loss to the manufacturer company or the user company. For providing protection against such analysis, there are a multiplicity of methods in which the surface of integrated circuits is covered so that the circuits cannot readily be analyzed.

Protective measures in the form of coverings can be circumvented, however, by stripping the coverings by etching away or by grinding and eroding subsequent layers, layer by layer. In the process, each newly emerging layer is acquired photographically or in some other way, so that a reliable picture of the overall construction of the semiconductor chip is obtained.

When grinding away a covering of a circuit arrangement formed on a substrate, where the substrate has a nonplanar, for example spherical, form, an analyzable surface cannot be removed layer by layer by the grinding method. Chemical separation of the covering by means of a solvent, an etchant or the like is still possible, however.

SUMMARY OF THE INVENTION

Consequently, the invention is based on an object of providing an integrated circuit arrangement which affords a high degree of protection against analysis.

This object is achieved according to the invention by means of an integrated circuit arrangement described below.

The invention provides for the layer of a substrate that carries circuit structures to be bonded to a carrier as a covering by means of an adhesive bond, the adhesive bond being produced from adhesives forming at least two adhesive tracks. In this case, it must be emphasized especially that it is not relevant to the invention which of the sides, that is to say the side having the circuit structures or the substrate side, forms an adhesive bond with the carrier. For simplification, the following explanations will always refer to the side having the circuit structures as a bearing area. Furthermore, it should be explained at this juncture that the adhesive bond can also be produced with films which form adhesive tracks and which form an adhesive bond in corresponding processing processes. In an advantageous manner, the first adhesive track is arranged in the outer region of bearing areas of mutually opposite sides of the layer and the carrier in a region of an externally accessible seam between the layer and the carrier. The second adhesive track runs parallel thereto in the inner region of the mutually opposite bearing areas of the layer and of the carrier.

The first adhesive track is produced from a chemically resistant adhesive, for example Teflon, and is thus resistant to chemical solvents. In order to obtain a high mechanical stability of the adhesive bond, that is to say in order to compensate for the weak mechanical stability of the first adhesive track formed in the outer region of the bearing areas of the adhesive bond, the second adhesive track is formed from an adhesive that is not chemically resistant but is mechanically stable, for example epoxy resin. As a result of this, the weak mechanical stability of the Teflon is compensated for and the chemically weak epoxy resin is protected by the Teflon boundary.

If the carrier has, by way of example, centrally arranged cutouts for leading connection wires toward the outside, these cutouts are also advantageously surrounded annularly by a further adhesive track made of the chemically resistant adhesive, thereby preventing penetration of solvents or dissolution of the carrier by means of solvents at these locations as well. In this case, the second adhesive track encloses the further adhesive track and is thus arranged between the first and further adhesive tracks and effects the necessary mechanical stability for both adhesive tracks.

Further advantageous refinements of the invention are specified below.

BRIEF DESCRIPTION OF THE DRAWINGS

The foregoing and other features of the present invention will be more readily apparent from the following detailed description and the drawing of an illustrative embodiment of the invention wherein like reference numbers refer to similar elements and in which.

DETAILED DESCRIPTION OF THE INVENTION

Figure 1:
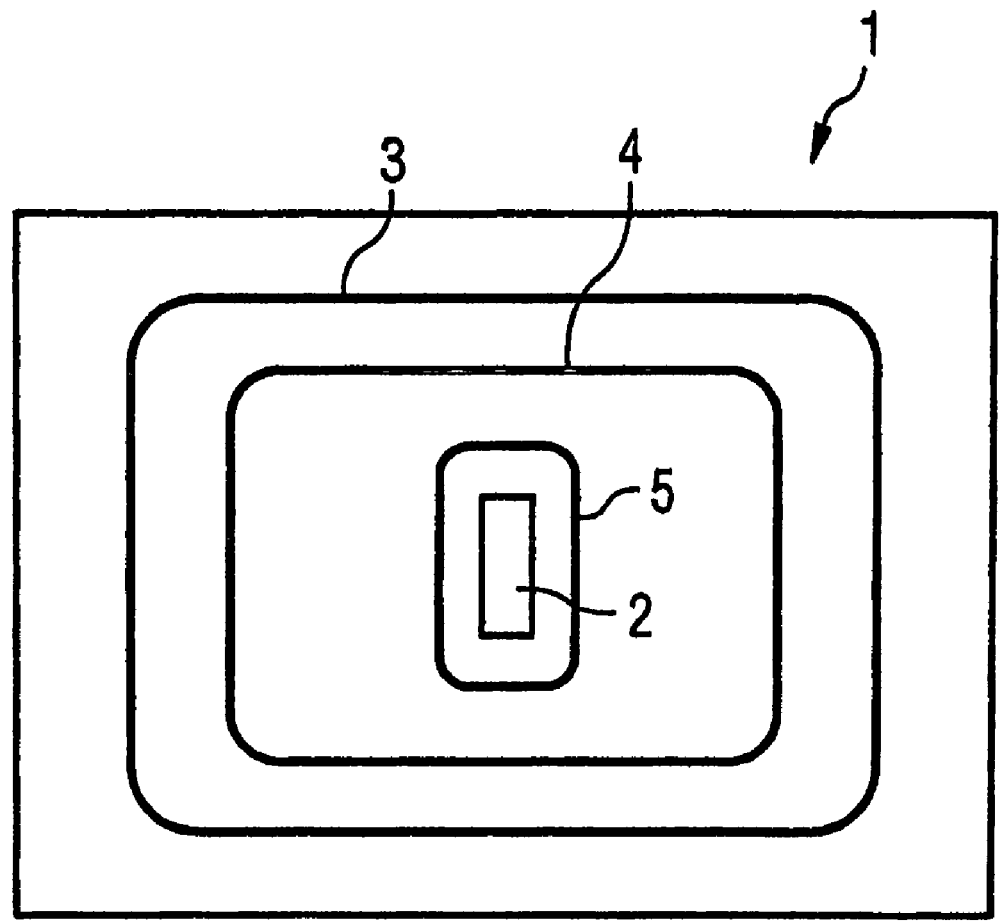
FIG. 1 is a diagrammatic plan view of a carrier of an integrated circuit arrangement according to the invention.

The figure illustrates a plan view of a carrier 1, which, by way of example, can be formed as a covering of a layer of a semiconductor component, which layer has circuit structures and is not shown here, and which is intended to be bonded to the layer by means of an adhesive bond. In this case, a basic area of the carrier 1 may correspond to a basic area of the layer, so that mutually opposite sides of the carrier 1 and the layer completely touch one another with their bearing areas. A cutout 2 arranged centrally in the carrier 1 serves for leading bonding wires fitted to pads of the layer, by way of example, toward the outside.

In the present exemplary embodiment, the dimensions of the basic area of the carrier 1 are larger than the basic area of the layer that is to be adhesively bonded to the carrier 1. In order to produce the adhesive bond, the carrier 1 has an annularly arranged first adhesive track 3 of an adhesive or of a film. The adhesive track is located at a distance from the external dimensions of the carrier 1. The basic area of the layer that is to be adhesively bonded to the carrier 1 corresponds approximately to the area bounded by the first adhesive track 3. An adhesive, for example Teflon, which is chemically resistant is used for the first adhesive track 3.

A second adhesive track 4 made of a mechanically stable adhesive, for example epoxy resin, or a film, which runs parallel to the first adhesive track 3, is applied on the carrier 1. A further adhesive track 5 of an adhesive or of a film, the properties of which correspond to those of the adhesive of the first adhesive track 3, is applied around the cutout 2 arranged in the central region of the carrier 1.

The first, second and further adhesive tracks 3, 4, 5 are illustrated in a simplified manner here as very thin lines. The dimension of the adhesive tracks 3, 4, 5 and the quantity of the adhesive to be used are dependent on the basic area of the elements that are to be adhesively bonded. In order to avoid air inclusions, the adhesive thickness may be chosen in such a way that an adhesive layer which is continuous and thus formed by adhesive tracks that have merged by flowing together with one another is formed after the adhesive bonding between mutually opposite sides or bearing areas of carrier 1 and layer. Consequently, sufficient damping of the strain between the adhesively bonded, different materials of carrier 1 and layer is also ensured. It should be mentioned supplementarily that the adhesives used for producing the adhesive tracks 3, 4, 5 can alternatively be applied to the bearing area of the layer.

If the layer is pressed onto the carrier 1 for the purpose of adhesive bonding, the adhesive tracks 3, 4, 5 form an areal film, particularly if the adhesives flow into one another. In particular, the positioning of the first adhesive track 3 and of the further adhesive track 5 around the cutouts 2 results in adhesive bonding of the seams of carrier 1 and layer, in which case the adhesives can propagate outward beyond the seams. On account of the chemically resistant properties of the adhesive used for the first adhesive track 3 and the further adhesive track 5, the layer cannot be stripped from the carrier 1 by means of conventional solvents. The adhesive film of the second adhesive track 4, which is formed in the inner region of the mutually opposite adhesively bonded bearing areas of the layer and of the carrier 1 is responsible for a high mechanical stability of the adhesive bond.

The basic idea of the present invention resides in the fact that a covering of a layer having circuit structures is bonded to the layer in such a way that the covering cannot be chemically stripped by means of conventional methods. By virtue of the parallel arrangement of adhesives having different properties, the use of a single adhesive that combines these properties only inadequately or the use of adhesive layers with different adhesives can be dispensed with. The combinational utilization of the material properties of different adhesives can be achieved very simply by means of the parallel arrangement.

What is claimed is:

1. An integrated circuit arrangement comprising:
   a substrate layer and a carrier having mutually opposing sides with bearing areas, the substrate layer carrying circuit structures; and
   an adhesive layer bonding the bearing areas of the substrate layer and the carrier, the adhesive layer comprising at least a first and a second adhesive track,
   the first adhesive track being formed in a region of an externally accessible seam between the substrate layer and the carrier, and
   the second adhesive track being formed parallel to the first adhesive track in an inner region of the bearing areas of the substrate layer and the carrier that face one another.

2. The integrated circuit arrangement as claimed in claim 1, further comprising a third adhesive track running parallel to the first and the second adhesive tracks in the inner region of the bearing areas of the substrate layer and the carrier that face one another.

3. The integrated circuit arrangement as claimed in claim 2, wherein the third adhesive track annularly encloses cutouts arranged in the carrier.

4. The integrated circuit arrangement as claimed in claim 2, wherein the third adhesive track is surrounded by the second adhesive track.

5. The integrated circuit arrangement as claimed in claim 1, wherein: the first and the second adhesive tracks are formed in areal fashion after the bearing areas of the substrate layer and the carrier have been adhesively bonded, and
the first and the second adhesive tracks touch one another.

6. The integrated circuit arrangement as claimed in claim 1, wherein the first adhesive track comprises a chemically resistant adhesive.

7. The integrated circuit arrangement as claimed in claim 1, wherein the second adhesive track comprises a mechanically stable adhesive.

8. The integrated circuit arrangement as claimed in claim 3, wherein the third adhesive track is surrounded by the second adhesive track.

9. The integrated circuit arrangement as claimed in claim 2, wherein:
   the first, the second, and the third adhesive tracks are formed in areal fashion after the bearing areas of the substrate layer and the carrier have been adhesively bonded, and
   at least two of the first, the second, and the third adhesive tracks touch one another.

10. The integrated circuit arrangement as claimed in claim 3, wherein:
    the first, the second, and the third adhesive tracks are formed in areal fashion after the bearing areas of the substrate layer and the carrier have been adhesively bonded, and
    at least two of the first, the second, and the third adhesive tracks touch one another.

11. The integrated circuit arrangement as claimed in claim 4, wherein:
    the first, the second, and the third adhesive tracks are formed in areal fashion after the bearing areas of the substrate layer and the carrier have been adhesively bonded, and
    at least two of the first, the second, and the third adhesive tracks touch one another.

12. The integrated circuit arrangement as claimed in claim 2, wherein the first and the third adhesive tracks comprise a chemically resistant adhesive.

13. The integrated circuit arrangement as claimed in claim 3, wherein the first and the third adhesive tracks comprise a chemically resistant adhesive.

14. The integrated circuit arrangement as claimed in claim 4, wherein the first and the third adhesive tracks comprise a chemically resistant adhesive.

15. The integrated circuit arrangement as claimed in claim 5, wherein the first adhesive track comprises a chemically resistant adhesive.

16. The integrated circuit arrangement as claimed in claim 6, wherein the chemically resistant adhesive is Teflon.

17. The integrated circuit arrangement as claimed in claim 12, wherein the chemically resistant adhesive is Teflon.

18. The integrated circuit arrangement as claimed in claim 13, wherein the chemically resistant adhesive is Teflon.

19. The integrated circuit arrangement as claimed in claim 14, wherein the chemically resistant adhesive is Teflon.

20. The integrated circuit arrangement as claimed in claim 15, wherein the chemically resistant adhesive is Teflon.

21. The integrated circuit arrangement as claimed in claim 7, wherein the mechanically stable adhesive is epoxy resin.

* * * * *